United States Patent
Seo (10) Patent No.: US 6,559,461 B1
(45) Date of Patent: May 6, 2003

(54) WAFER SCANNING SUPPORT UNIT OF ION IMPLANTATION APPARATUS

(75) Inventor: Sang-Il Seo, Inchon (KR)

(73) Assignee: Samsung Electronics Co., Ltd., Suwon (KR)

( * ) Notice: Subject to any disclaimer, the term of this patent is extended or adjusted under 35 U.S.C. 154(b) by 259 days.

(21) Appl. No.: 09/689,823

(22) Filed: Oct. 13, 2000

(30) Foreign Application Priority Data

Nov. 22, 1999 (KR) .............................. 99-51880

(51) Int. Cl.⁷ ................................ H01J 37/30
(52) U.S. Cl. .................... 250/492.21; 250/442.11; 250/398
(58) Field of Search ................. 250/492.21, 442.11

(56) References Cited

U.S. PATENT DOCUMENTS

| | | | | |
|---|---|---|---|---|
| 3,733,494 A | * | 5/1973 | Erwin, Jr. .................... | 290/38 |
| 5,003,183 A | * | 3/1991 | Nogami et al. .......... | 250/492.2 |
| 5,030,835 A | * | 7/1991 | Tamai et al. ............. | 250/492.2 |
| 5,898,179 A | * | 4/1999 | Smick et al. .......... | 250/492.21 |
| 5,966,160 A | * | 10/1999 | Nardone et al. ............ | 347/218 |

* cited by examiner

Primary Examiner—John R. Lee
Assistant Examiner—Paul Gurzo
(74) Attorney, Agent, or Firm—Volentine Francos, PLLC (57) ABSTRACT

A wafer scanning support unit of an ion implantation apparatus includes a vacuum chamber having an opening in one side thereof for admitting an ion beam, and a wafer scanning support disposed within the vacuum chamber for supporting a wafer at an inclination and moving the wafer up and down in front of the ion beam so that the wafer is scanned. The wafer scanning support includes a scan shaft pivotally mounted about a horizontal axis so that it can be inclined relative to the vertical, an elevating member slidingly coupled to the scan shaft so as to be movable therealong, a driving motor for moving the elevating member up and down along the scan shaft, and a wafer holder connected to the elevating member so as to be movable therewith. The inclined wafer holder is moved along an inclined path corresponding to the inclination of the scan shaft, so that the ion beam travels substantially the same distance to impinge all portions of the wafer including the uppermost and bottommost parts. Thus, the ion-implantation process is carried out uniformly across the surface of the wafer. In addition, the position of the scan shaft can be set based on the parameters of the process, such as the size of the wafer and the desired characteristics produced by the ion-implantation process.

14 Claims, 6 Drawing Sheets

WAFER SCANNING SUPPORT UNIT OF ION IMPLANTATION APPARATUS

BACKGROUND OF THE INVENTION

1. Field of the Invention

The present invention relates to an ion implantation apparatus. More particularly, the present invention relates to an ion implantation apparatus for scanning a wafer with an ion beam to implant ions into the surface of the wafer in the fabricating of a semiconductor device.

2. Description of the Related Art

In general, an ion implantation process is one of the processes used to fabricate a semiconductor device. In this process, particles of a predetermined impurity are accelerated and are formed into an ion beam directed towards a particular part of a wafer. The ion beam or the wafer is continually moved horizontally or vertically, whereby the ions are implanted into the entire surface of the wafer.

Figure 1:
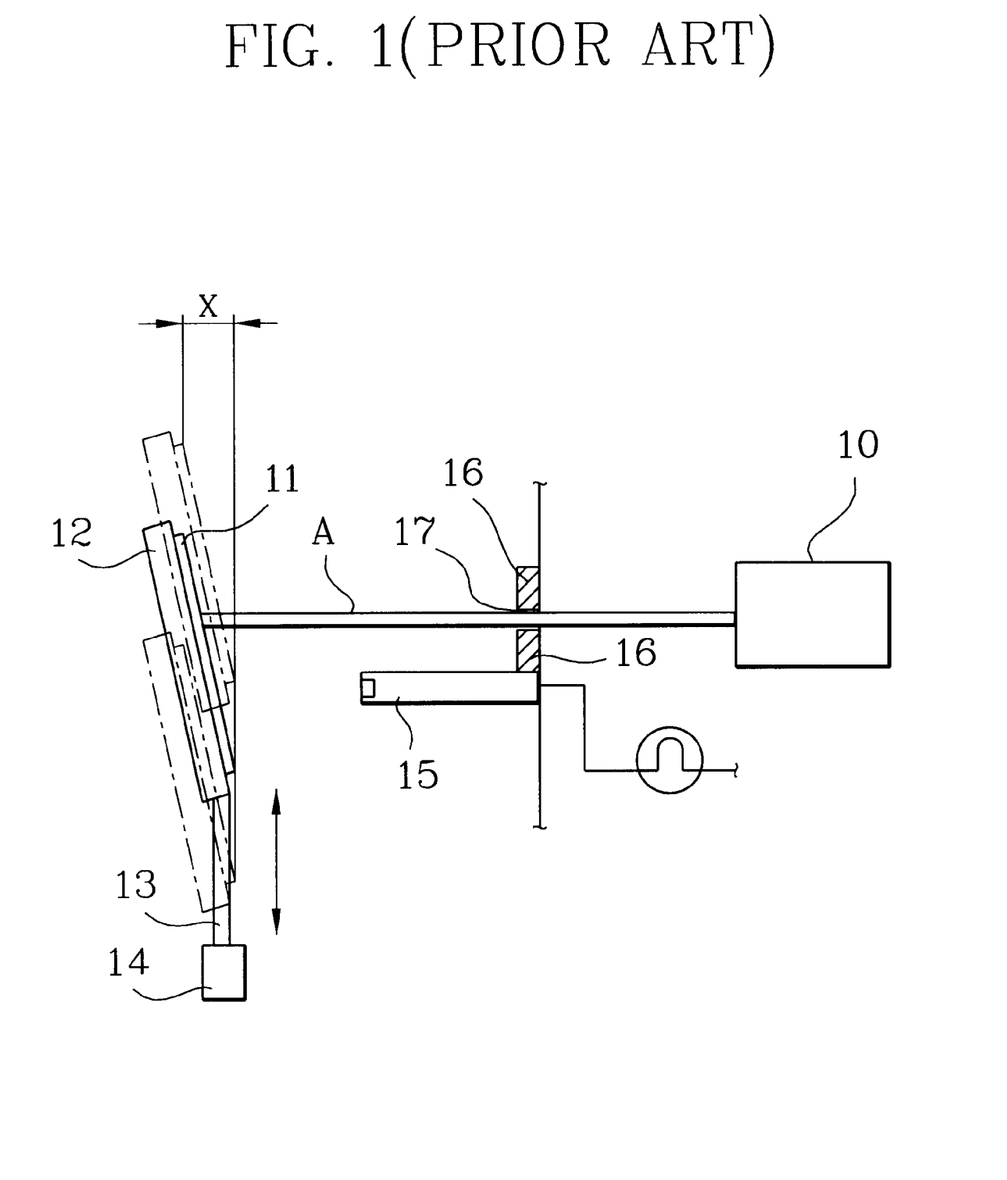
FIG. 1 is a schematic diagram of a conventional ion implantation apparatus.

A conventional ion implantation apparatus is disclosed in Japanese Patent No. Hei 04-283923. The apparatus, as shown in FIG. 1, comprises: parallel ion beam radiating means 10, a mask 16 having a slit 17 therein, a support plate 12 for supporting a wafer 11, elevation driving means 14 for raising and lowering the support plate 12 via a driving shaft 13 integral with a bottom part of the support plate 12, and an electrostatic flux type of charge monitor 15 disposed near the bottom of the ion beam A as it passes through the slit 17 in the mask 16.

The parallel ion beam radiating means 10 produces an ion beam A. The ion beam A passes through the slit 17 of the mask 16, and is accelerated by a separate speed-up pipe. Then the ions of the beam A are then implanted into the wafer 11 mounted on the support. At this time, the driving shaft 13 is raised and lowered by the elevation driving means 14, while the support plate 12 is tilted horizontally or vertically by about 7 degrees, to execute a scanning process in the Y-direction.

Moreover, at this time, the topmost and bottommost parts of the wafer 11 are offset horizontally from each other by a distance X due to the slope of the support plate 12. That is, there is a difference in the distance that the ion beam A propagates from the parallel ion beam radiating means 10 before reaching the topmost and bottommost parts of the wafer 11. This difference brings about a variation in the amount of ions distributed over and hence, implanted into the wafer 11. These variations in the amount of ions implanted into the wafer 11 create a variety of problems, such as inconsistencies in the quality of the semiconductor devices produced from the wafer. Some of the devices are even of insufficient quality.

SUMMARY OF THE INVENTION

Therefore, one object of the present invention is to solve the aforementioned problems by providing an ion implantation apparatus that minimizes the difference in distance that an ion beam must travel before reaching topmost and bottommost parts of a wafer during the scanning of the wafer, whereby the ion-implantation process is carried out uniformly across the surface of the wafer.

Another object of the present invention is to provide an ion implantation apparatus which can achieve such a uniform distribution of ions for wafers of various sizes and produce different characteristics in the wafers as the result of the ion-implantation process.

In order to achieve the aforementioned objects, the present invention provides a wafer scanning support which includes a scan shaft pivotally mounted about a horizontal axis so that it can be inclined relative to the vertical, an elevating member slidingly coupled to said scan shaft so as to be movable therealong, a driving motor for moving the elevating member up and down along the scan shaft, and a wafer holder connected to the elevating member so as to be movable therewith.

The wafer scanning support unit may also include horizontal maintaining means for positioning the wafer holder in the horizontal direction. The horizontal maintaining means includes a horizontal transfer member coupled to the elevating member so as to move therewith. On the other hand, a vertical maintaining means is provided for positioning the wafer holder in the vertical direction. The vertical maintaining means includes a vertical transfer member coupled with an end of the horizontal transfer member so as to move therewith.

The wafer holder can be incorporated into a tilter mounted to an end of the vertical transfer member. The tilter is operative to place the wafer holder in an upwardly facing position to facilitate the loading or unloading of the wafer.

According to the present invention, the scan shaft can be inclined at a predetermined position. As the elevating member is moved upwardly and downwardly along the scan shaft during scanning, the inclined wafer holder is moved along an inclined path corresponding to the inclination of the scan shaft, whereby the ion beam travels substantially the same distance to impinge all portions of the wafer including the uppermost and bottommost parts. In addition, the position of the scan shaft can be set based on the parameters of the process, such as the size of the wafer and the desired characteristics to be provided by the ion-implantation process.

Moreover, the horizontal and vertical maintaining means allow the wafer support to be moved to the same loading and unloading position irrespective of the position of the scan shaft.

BRIEF DESCRIPTION OF THE DRAWINGS

The above and other objects, features and advantages of the present invention will become clearer by referring to the following detailed description of the preferred embodiment thereof made with reference to the accompanying drawings, of which.

DETAILED DESCRIPTION OF THE PREFERRED EMBODIMENT

Figure 2:
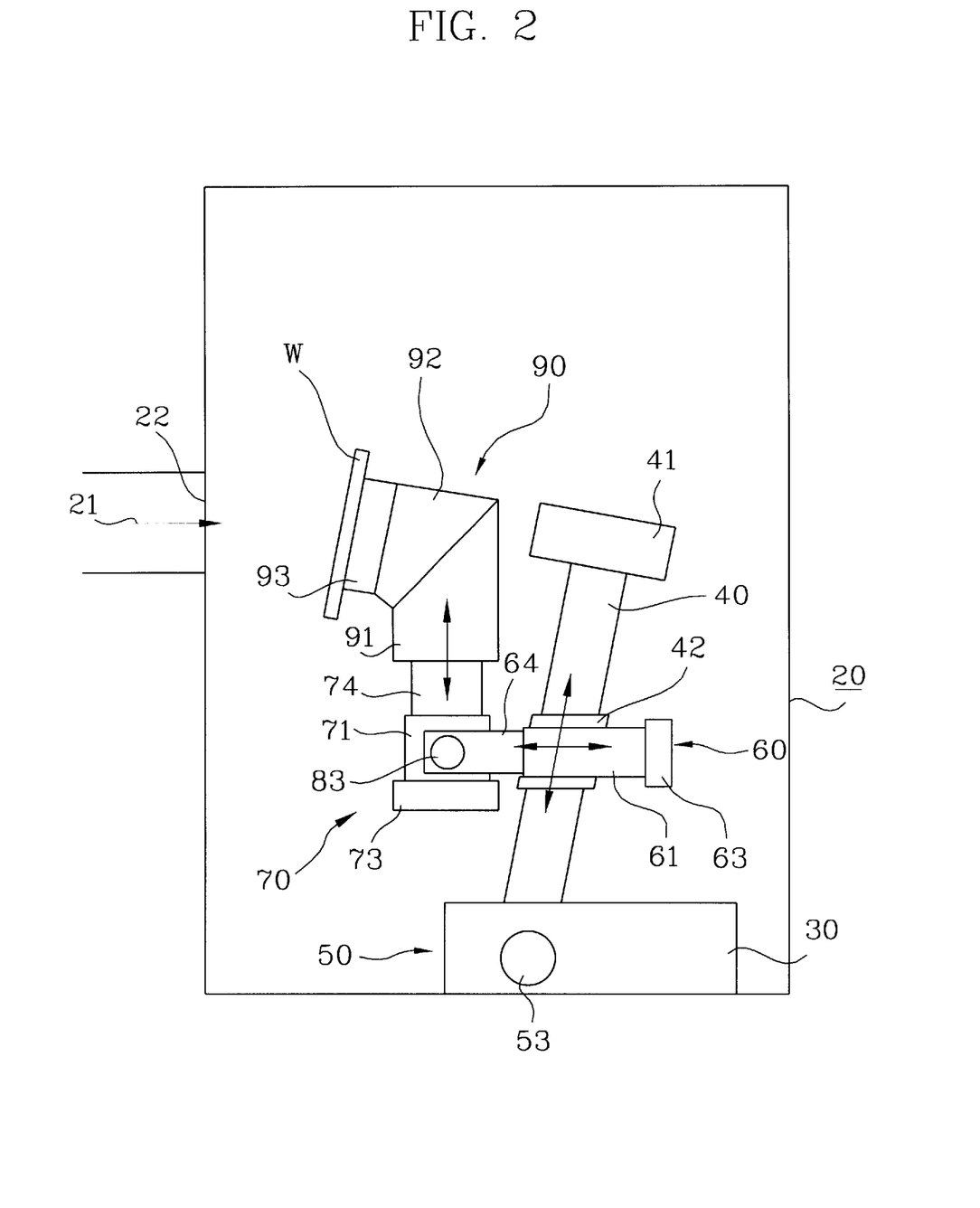
FIG. 2 is a schematic diagram of a wafer scanning support unit of an ion implantation apparatus according to the present invention

Referring first to FIG. 2, the ion implantation apparatus of the present invention includes a vacuum chamber 20 having an opening 22 at one side thereof for admitting an ion beam 21 propagating from ion radiating means (not shown). A fixing member 30 is secured at the bottom of the vacuum chamber 20, and a scan shaft 40 is pivotally mounted to the fixing member 30 about a first horiontal axis.

A first driving motor 41 is mounted to the top of the scan shaft 40. An elevating member 42 is slidingly fitted to the scan shaft 40 and is engaged with the first driving motor 41 so that it can be reciprocated therealong by the first driving motor 41.

Figure 3:
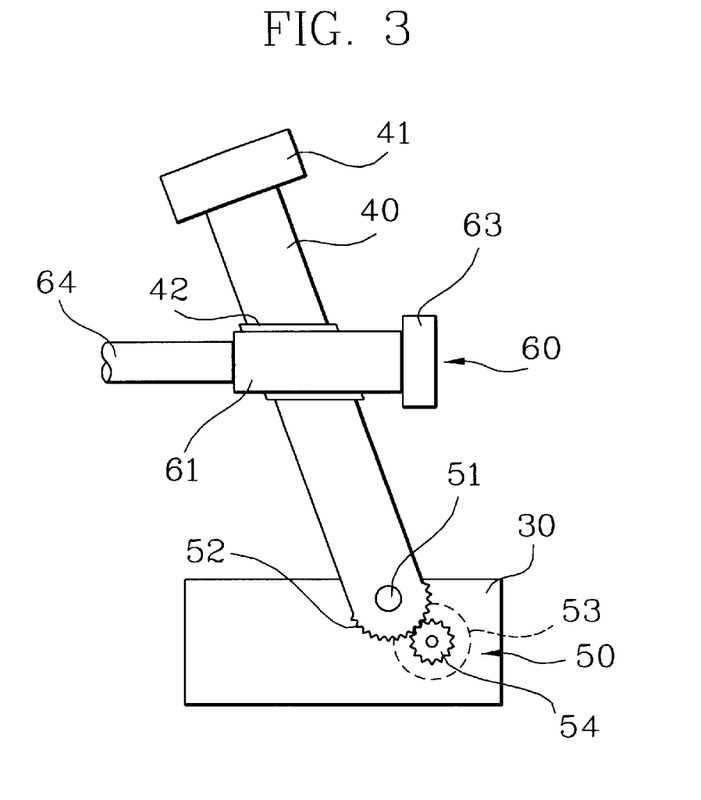
FIG. 3 is a perspective view of part of a wafer scanning support of the ion implantation apparatus of the present invention.

Furthermore, a scan shaft maintaining means 50 is engaged with the lower part of the scan shaft 40 for pivoting the scan shaft 40 to a given angular position. As shown in FIG. 3, the scan shaft maintaining means 50 comprises a hinge pin 51 by which the scan shaft 40 is pivotally mounted to a lateral surface of the fixing member 30, an arcuate gear part 52 integral with the bottom part of the scan shaft 40, and a driving gear 54 meshing with the teeth of the arcuate gear part 52. A second driving motor 53 is coupled to the driving gear 54, whereby the inclination of the scan shaft 40 can be set by rotating the driving gear 54 with the second driving motor 53.

Figure 4:
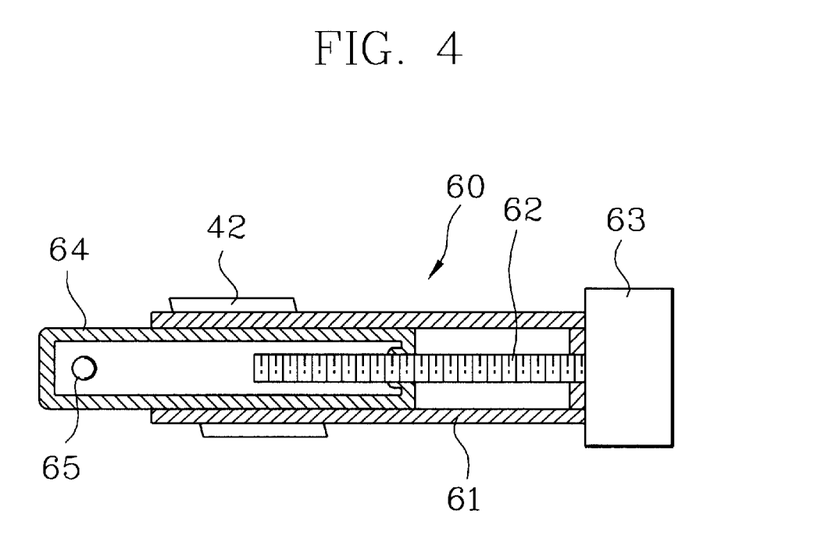
FIG. 4 is a cross-sectional view of horizontal maintaining means of the wafer scanning support.

A horizontal maintaining means 60 is attached to the elevating member 42. As shown in FIG. 4, the horizontal maintaining means 60 comprises a cylinder 61 mounted to the elevating member 42, a third driving motor 63 having a threaded output shaft 62 and mounted to one end of the cylinder 61, and a horizontal transfer member 64 extending into the other end of the cylinder 61 and threadingly engaged with the screw shaft 62. In addition, a through-hole 65 is formed at an end of the horizontal transfer member 64. The horizontal transfer member 64 is moved forward or backward by the screw shaft 62 when the screw shaft 62 is rotated by the third driving motor 63.

Figure 5:
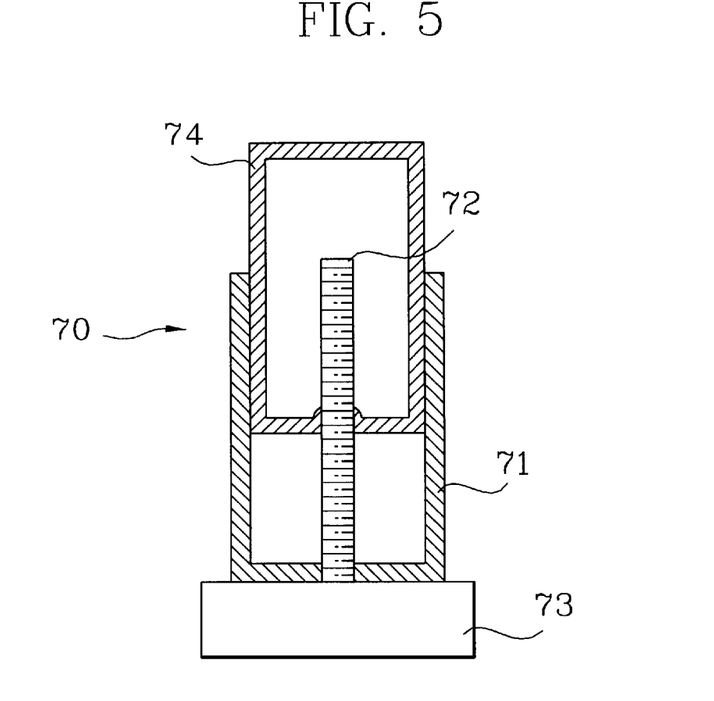
FIG. 5 is a cross-sectional view of vertical maintaining means of the wafer scanning support.

On the other hand, a vertical maintaining means 70 is coupled to one end of the horizontal maintaining means 60. The vertical maintaining means 70 is structurally similar to the horizontal maintaining means 60. As shown in FIG. 5, the vertical maintaining means 70 comprises a cylinder 71, a fourth driving motor 73 mounted to one end of the cylinder 71, and a vertical transfer member 74 extending into the cylinder 71 from the other side thereof side thereof and mated with a threaded output shaft 72 of the fourth driving motor 73.

Figure 6:
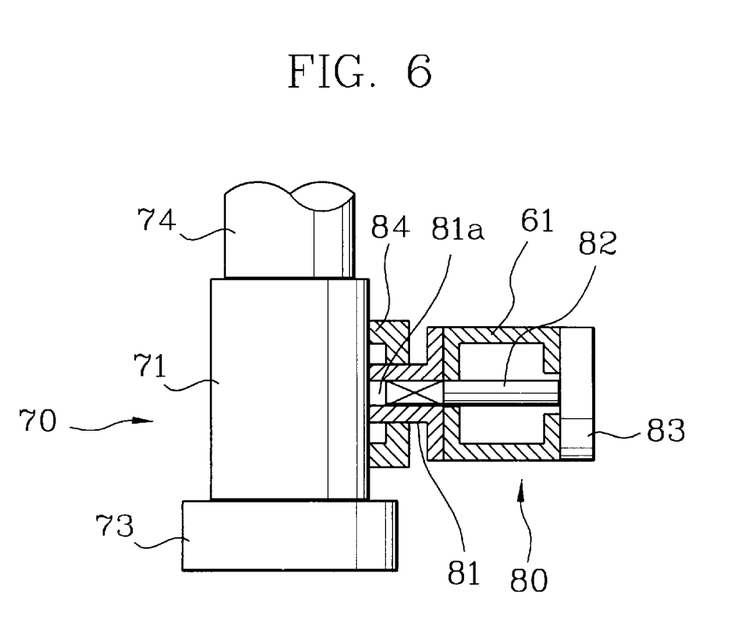
FIG. 6 is a sectional view of the coupling of the horizontal and vertical maintaining means, of the present invention.

The vertical maintaining means 70 is coupled to one side of the horizontal maintaining means 60 by a rotary coupling 80, so as to be rotatable about a second horizontal axis parallel to that about which the scan shaft 40 can pivot. As shown in FIG. 6, the rotary coupling 80 includes a protrusion 81 defining a hole 81a therethrough. One end of the protrusion 81 is fixed to one side surface of the cylinder 71, and the other end of the protrusion 81 is fixed to the end of cylinder 61. A fifth driving motor 83 is also fixed to the end of the cylinder 61. A rotary output shaft 82 of the fifth driving motor 83 extends through through-hole 65 and into the hole 81a in the protrusion 81, where it is fixed to the protrusion 81. A cap member 84 is formed at the side of the cylinder 71 for supporting the protrusion 81.

Because the end of the rotational shaft 82 is fixed to the protrusion 81, the rotation of the output shaft 82 of the fifth driving motor 83 can pivot the vertical maintaining means 70 to a predetermined angular position.

In addition, a tilter 90 is coupled to an upper end of the vertical maintaining means 70 for facilitating the loading or unloading of a wafer W. The tilter 90 includes a supporting member 91 mounted to an end of the vertical transfer member 74, a rotary member 92 coupled with the supporting member 91, and a holder 93 coupled to an end of the rotary member 92 for supporting the wafer W. The rotary member 92 can be rotated by driving means, e.g. a motor (not shown), about a plane inclined by about 45° relative to the vertical, whereby rotation of the rotary member 92 relative to the supporting member 91 can move the wafer holder 93 between respective positions at which the wafer holder 93 faces the opening 22 in the vacuum chamber 20 and faces upwardly to facilitate the loading and unloading of a wafer.

The remainder of the ion implantation apparatus is conventional and can take the form of that shown in FIG. 1. In the ion implantation apparatus of the present invention having a wafer support as described above, the wafer W is supported by the tilter 90 while a vacuum of a predetermined level is maintained in the vacuum chamber 20.

At this time, the inclination of the scan shaft 40 in the vertical direction is set depending on certain parameters, namely the size of the wafer W or characteristics desired of the ion implantation. If a change is made to such parameters, a value indicative of the change is input to a controller (not shown) and the controller then drives the second driving motor 53 accordingly to change the inclination of the scan shaft 40.

When the inclination of the scan shaft 40 is changed, the position of the vertical maintaining means 70 and tilter 90 relative to the scan shaft 40 is changed by the driving motor 83 of the connecting means 80. Specifically, the fifth driving motor 83 drives the rotational shaft 82 over an angle necessary to keep the vertical maintaining means 70 in its vertical state, i.e., to maintain its inclination relative to the scan shaft 40.

Figure 7:
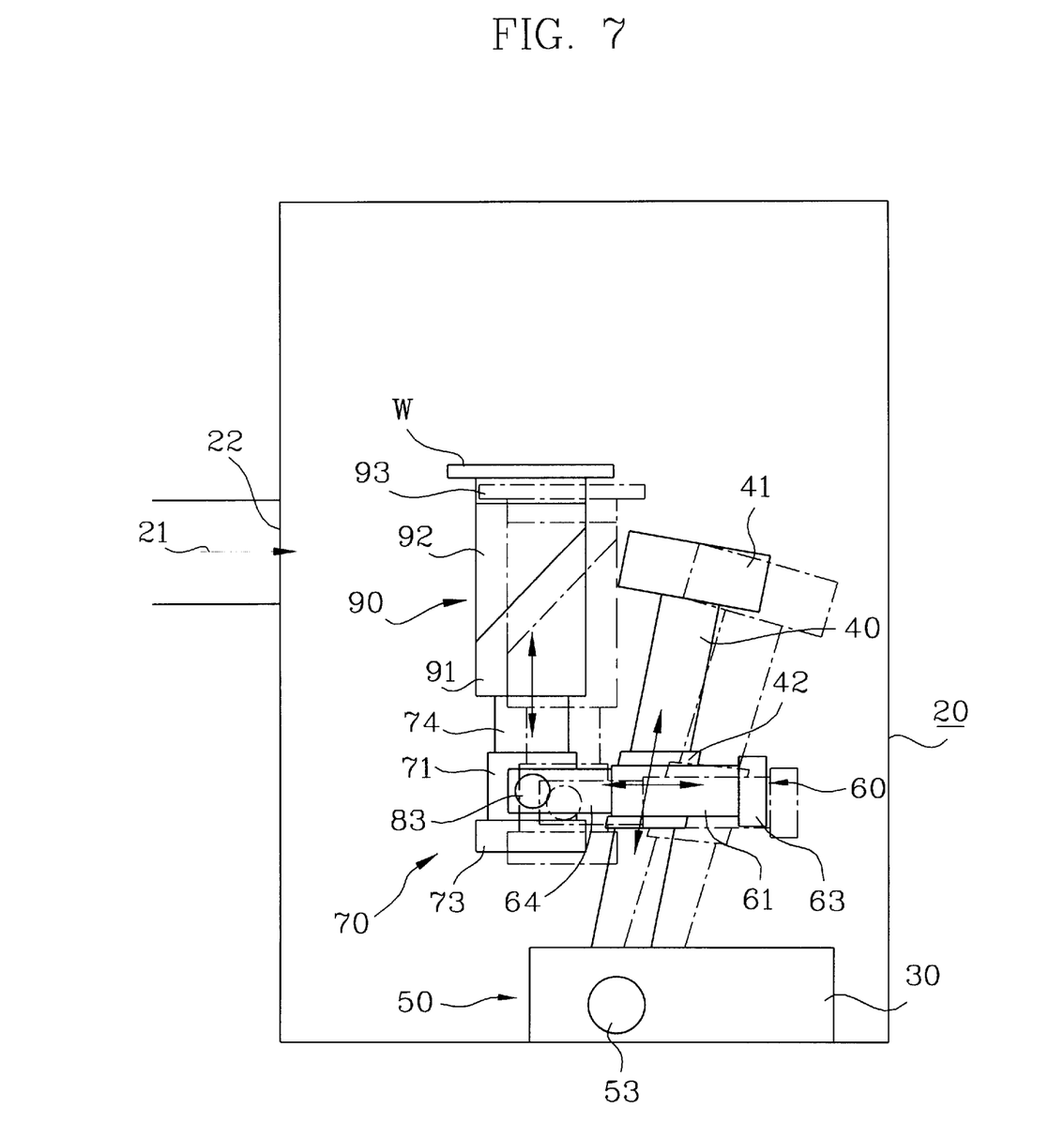
FIG. 7 is another schematic diagram of the wafer scanning support unit of the ion implantation apparatus of the present invention, in a loading or unloading state.

After the scan shaft 40 is positioned, the wafer W is loaded onto the tilter 90. In this situation, the rotary member 92 is rotated 180 degrees so that the holder 93 is positioned to face upwards, as shown in FIG. 7. The horizontal and vertical maintaining means 60, 70 allow the loading/unloading position to remain fixed in the apparatus irrespective of the inclined position of the scan shaft 40.

Next, the horizontal position of the tilter 90 is set by the horizontal maintenance means 60. That is, the third driving motor 63 operates to rotate the screw shaft 62, thereby moving the horizontal transfer member 64. Hence, the tilter 90, is positioned in the horizontal direction. On the other hand, the vertical transfer member 74 is moved vertically by the screw shaft 72 as rotated by the fourth driving motor 73. Accordingly, the tilter 90 mounted to the vertical transfer member 74 is positioned in the vertical direction.

The tilter 90 is moved in this way to place the holder 93 at the loading (or unloading position). A robot or other similar means (not shown) operates to load the wafer W onto the holder 93 (or to unload the wafer W therefrom).

After the wafer W has been loaded onto the holder 93, the rotary member 92 is driven to rotate the holder 93 to its initial state, and the horizontal and vertical maintaining means 60, 70 operate to position the wafer W close to the opening 22.

Figure 8:
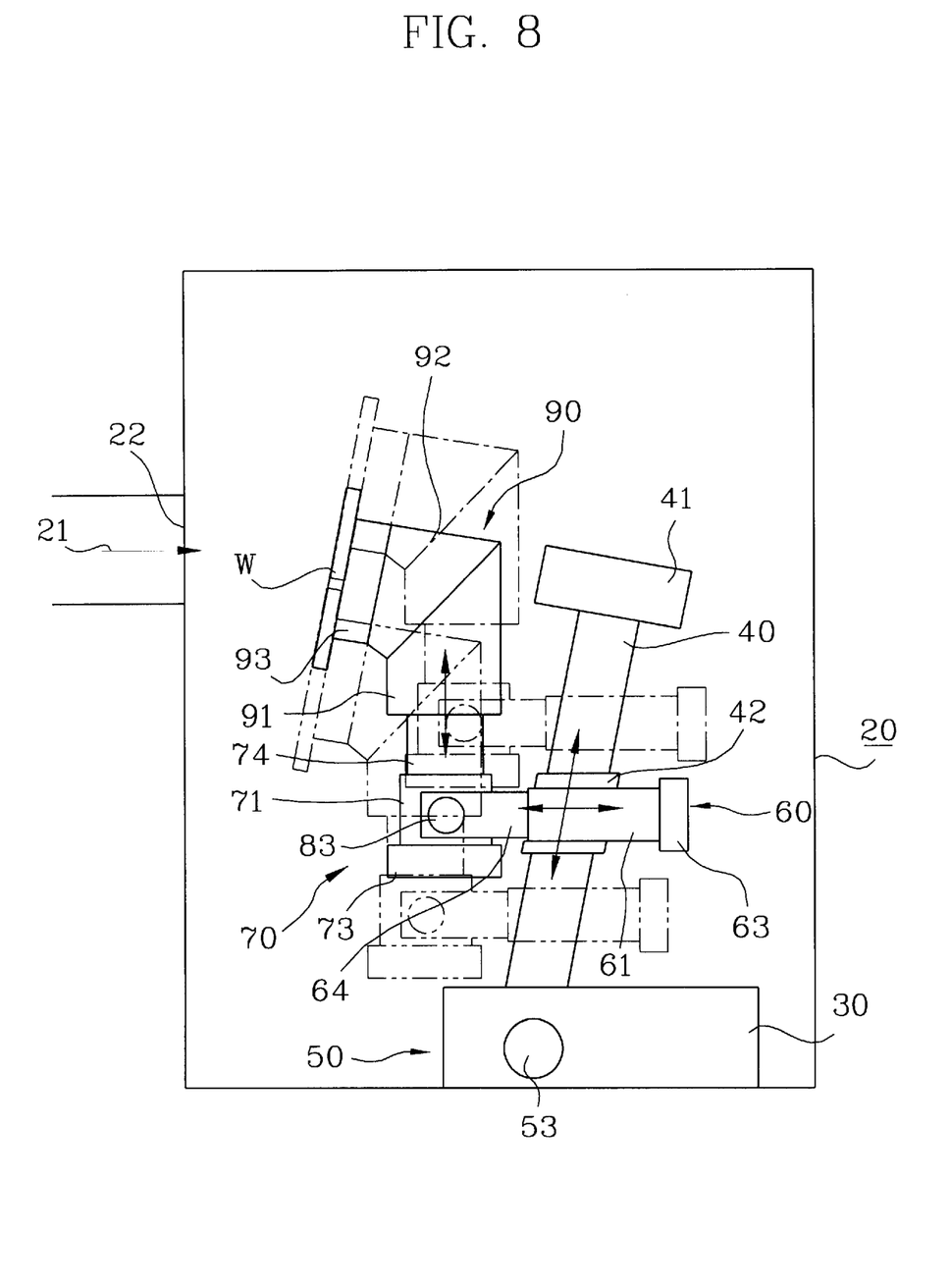
FIG. 8 is a similar diagram of the wafer scanning support unit of the present invention, but in an operational state.

At this time, the ion beam 21 produced by the ion radiating means (not shown) is induced through the opening 22 into the vacuum chamber 20, and the first driving motor 41 repeatedly rotates its output shaft forward and backward to raise and lower the wafer W so that the wafer is scanned with the ion beam. In this case, the elevating member 42 is raised and lowered along the inclined scan shaft 40. The horizontal maintaining means 60 coupled to the elevating member 42, and the vertical maintaining means 70, and the tilter 90, are raised and lowered with the elevation member 42 so that ions are distributed over the surface of the wafer W mounted at the holder 93 of the tilter 90. Because the scan shaft is set at a predetermined inclination, the ion beam will travel substantially the same distance when it impinges the wafer W irrespective of the movement of the wafer W in the vertical direction.

After the ion implantation process is completed, the horizontal and vertical maintaining means 60, 70, and tilter 90 operate to place the holder 93 at the unloading position. Then, the ion-implanted wafer W is unloaded, and a new wafer W is loaded. Next, the aforementioned processes are sequentially performed to execute the ion implantation processes on the new wafer W.

As described above, the present invention makes it is possible to set the scan shaft to an inclination, relative to the vertical, based on the parameters of the ion implantation process, such as wafer size, and to maintain the slope of the scan shaft during the scanning of the wafer with the ion beam, and thereby minimize the difference in the distance that the ion beam travels to the topmost and bottommost parts of the wafer. Accordingly, the present invention makes it possible to distribute the ions uniformly over the surface of the wafer and thus enhance the quality of the wafer product from which the semiconductor devices will be produced.

Although the present invention has been described above with respect to the preferred embodiment thereof, various changes thereto and modifications thereof will be apparent to those of ordinary skill in the art. All such changes and modifications are seen to be within the true spirit and scope of the invention as defined by the appended claims.

What is claimed is:

1. A wafer scanning support unit of an ion implantation apparatus, comprising:
    a vacuum chamber having an opening at one side thereof for admitting an ion beam into the chamber; and
    a scanning wafer support disposed within said vacuum chamber, said wafer scanning support including
        a fixing member,
        a vertically extending scan shaft mounted to said fixing member so as to be pivotable in a plane about a first horizontal axis, whereby the inclination of the scan shaft, relative to the vertical, can be changed,
        an elevating member slidingly fitted to said scan shaft so as to be movable up and down therealong,
        a first driving motor engaged with said elevating member so as to drive said elevating member along said scan shaft,
        a horizontal transfer member coupled to said elevating member so as to move vertically therewith and so as to be movable horizontally relative thereto within said plane,
        a horizontal driving motor engaged with said horizontal transfer member so as to move said horizontal transfer member horizontally along said plane relative to said scan shaft and elevating member,
        a vertical transfer member coupled to said horizontal transfer member so as to move horizontally therewith,
        a vertical driving motor engaged with said vertical transfer member so as to move said vertical transfer member vertically, and
        a wafer holder mounted to said vertical transfer member for vertical and horizontal translational movement with said vertical transfer member and said horizontal transfer member, respectively, independently of the pivotal movement of said scan shaft.

2. The wafer scanning support unit support unit as claimed in claim 1, and further comprising a horizontally extending hinge pin extending into said fixing member and into an end of said scan shaft, said hinge pin pivotally mounting said scan shaft to said fixing member, gear teeth integral with said end of the scan shaft, a gear intermeshed with said gear teeth, and a second driving motor having an output shaft to which said gear is connected, whereby said second driving motor operates to place said scan shaft in position at an inclination relative to the vertical.

3. The wafer scanning support unit support unit as claimed in claim 1, and further comprising a cylinder mounted to said elevating member, said horizontal transfer member being slidingly coupled to said cylinder, and wherein said horizontal driving motor is mounted to said cylinder and has a threaded output shaft in a threaded mating engagement with said horizontal transfer member, whereby rotation of said threaded output shaft by said horizontal driving motor moves said horizontal transfer member vertically relative to said cylinder.

4. The wafer scanning support unit support unit as claimed in claim 1, and further comprising a cylinder fixed to an end of said horizontal transfer member so as to move therewith, said vertical transfer member being slidingly coupled to said cylinder so as to be movable vertically relative thereto, and wherein said vertical driving motor is mounted to said cylinder and has a threaded output shaft in a threaded mating engagement with said vertical transfer member, whereby rotation of said threaded output shaft by said vertical driving motor moves said vertical transfer member vertically relative to said cylinder.

5. The wafer scanning support unit support unit as claimed in claim 1, and further comprising a rotary coupling pivotally connecting said vertical transfer member to said horizontal transfer member about a second horizontal axis parallel to said first horizontal axis, whereby the inclination of said vertical transfer member relative to the scan shaft can be adjusted.

6. The wafer scanning support unit support unit as claimed in claim 5, wherein said coupling comprises a protrusion connected to said vertical transfer member, and a protrusion driving motor supported by said horizontal transfer member and having a rotary output shaft extending through an end of the horizontal transfer member and fixed to said protrusion.

7. The wafer scanning support unit support unit as claimed in claim 1, and further comprising a supporting member fixed to said vertical transfer member, and a rotary member to which said wafer holder is mounted, said rotary member being rotatably supported by said supporting member and slidingly engaged therewith about a plane inclined by about 45° relative to the vertical, whereby rotation of said rotary member relative to said supporting member can move said wafer holder between respective positions at which the wafer holder faces said opening in the vacuum chamber and faces upwardly to facilitate the loading and unloading of a wafer.

8. A wafer scanning support of an ion implantation apparatus, comprising:
    a fixing member;
    a vertically extending scan shaft mounted to said fixing so as to be pivotable in a plane about a first horizontal axis, whereby the inclination of the scan shaft, relative to the vertical, can be changed;

an elevating member slidingly coupled to said scan shaft so as to be movable therealong;

a driving motor engaged with said elevating member for moving the elevating member up and down along the scan shaft;

a wafer holder connected to the elevating member so as to move therewith; and a horizontal transfer member movable horizontally along said plane independently of the pivotal movement of said scan shaft in said plane, said wafer holder being coupled to said horizontal transfer member for horizontal translational movement such that the wafer holder is also movable horizontally along said plane independently of the pivotal movement of said scan shaft in said plane.

9. The wafer scanning support as claimed in claim 8, wherein said horizontal transfer member is coupled with and extends from said elevating member, and further comprising a vertical member supporting said wafer holder, and a rotary coupling interconnecting said horizontal transfer and vertical members such that the vertical member is rotatable relative to said horizontal transfer member about a second horizontal axis parallel to said first horizontal axis.

10. The wafer scanning support as claimed in claim 8, and further comprising a first cylinder fixed to said elevating member, said horizontal transfer member being fitted to said first cylinder so as to be slidable relative thereto in a horizontal linear direction in said plane, a second cylinder coupled to said horizontal transfer member, and a vertical transfer member fitted to said second cylinder so as to be slidable relative thereto in a vertical direction, said wafer holder being mounted to said vertical transfer member.

11. The wafer scanning support as claimed in claim 10, and further comprising a rotary coupling interconnecting said horizontal transfer member and said second cylinder such that said vertical transfer member is rotatable relative to said horizontal transfer member about a second horizontal axis parallel to said first horizontal axis.

12. The wafer scanning support as claimed in claim 11, wherein said rotary coupling comprises a drive motor for rotating said second cylinder about said second horizontal axis relative to said horizontal transfer member.

13. The wafer scanning support as claimed in claim 10, and further comprising a horizontal driving motor supported by said first cylinder and engaged with said horizontal transfer member so as to move said horizontal transfer member horizontally, and a vertical driving motor supported by said second cylinder and engaged with said vertical transfer member so as to move said vertical transfer member vertically.

14. The wafer scanning support as claimed in claim 10, and further comprising a horizontally extending hinge pin extending into said fixing member and into an end of said scan shaft, said hinge pin pivotally mounting said scan shaft to said fixing member, gear teeth integral with said end of the scan shaft, a gear intermeshed with said gear teeth, and a driving motor having an output shaft to which said gear is connected, whereby said driving motor operates to place said scan shaft in position at an inclination relative to the vertical.

* * * * *